US011727988B2

(12) United States Patent
Kim et al.

(10) Patent No.: US 11,727,988 B2
(45) Date of Patent: Aug. 15, 2023

(54) TERNARY MEMORY CELL FOR LOGIC-IN-MEMORY AND MEMORY DEVICE COMPRISING SAME

(71) Applicant: UNIST(ULSAN NATIONAL INSTITUTE OF SCIENCE AND TECHNOLOGY), Ulsan (KR)

(72) Inventors: Kyung Rok Kim, Ulsan (KR); Jae Won Jeong, Seoul (KR); Young Eun Choi, Ulsan (KR)

(73) Assignee: UNIST(ULSAN NATIONAL INSTITUTE OF SCIENCE AND TECHNOLOGY), Ulsan (KR)

(*) Notice: Subject to any disclaimer, the term of this patent is extended or adjusted under 35 U.S.C. 154(b) by 237 days.

(21) Appl. No.: 17/424,492

(22) PCT Filed: Apr. 3, 2020

(86) PCT No.: PCT/KR2020/004560
§ 371 (c)(1),
(2) Date: Jul. 20, 2021

(87) PCT Pub. No.: WO2020/226283
PCT Pub. Date: Nov. 12, 2020

(65) Prior Publication Data
US 2022/0084594 A1 Mar. 17, 2022

(30) Foreign Application Priority Data
May 8, 2019 (KR) .................... 10-2019-0053899

(51) Int. Cl.
G11C 15/04 (2006.01)
(52) U.S. Cl.
CPC .................... G11C 15/04 (2013.01)
(58) Field of Classification Search
CPC .................................................. G11C 15/04
(Continued)

(56) References Cited

U.S. PATENT DOCUMENTS 6,845,025 B1* 1/2005 Nataraj ................ G11C 15/04
365/189.11
6,888,730 B2 5/2005 Foss et al.
(Continued)

FOREIGN PATENT DOCUMENTS

KR 10-2009-0010247 A 1/2009
KR 10-1689159 B1 12/2016
(Continued)

OTHER PUBLICATIONS

International Search Report and Written Opinion for PCT/KR2020/004560, dated Jul. 28, 2020.
(Continued)

*Primary Examiner* — Connie C Yoha
(74) *Attorney, Agent, or Firm* — Klarquist Sparkman, LLP

(57) ABSTRACT

According to an embodiment of the present disclosure, a memory device for a logic-in-memory may include a cell array including a plurality of ternary memory cells, a row decoder configured to select at least one ternary memory cell from among the plurality of ternary memory cells, and a page buffer configured to provide a first value to the at least one ternary memory cell and latch a third value obtained by performing a logic operation on the first value and a second value stored in the at least one ternary memory cell and/or the second value. The at least one ternary memory cell may include: a first inverter and a second inverter, cross-coupled in a first node corresponding to the second value and a second node corresponding to an inverted value of the second value, and including a pull-up device and a pull-down device, wherein the pull-up device and the pull-down device are configured to have a constant current pass therethrough upon turn-off; and a logic operation circuit including a P-channel transistor and an N-channel transistor and configured to output the third value, wherein the P-channel
(Continued)

transistor and the N-channel transistor are configured to have the constant current pass therethrough upon turn-off.

14 Claims, 17 Drawing Sheets

(58) Field of Classification Search
USPC ...................................................... 365/49.11
See application file for complete search history.

(56) References Cited

U.S. PATENT DOCUMENTS

| | | | |
|---|---|---|---|
| 7,259,979 B2 * | 8/2007 | Sachan | .................. H10B 10/18 |
| | | | 365/72 |
| 7,567,094 B2 | 7/2009 | Shastri | |
| 9,292,425 B2 | 3/2016 | Choi et al. | |
| 10,050,042 B2 | 8/2018 | Chen et al. | |
| 10,133,550 B2 | 11/2018 | Kim et al. | |
| 2022/0413800 A1 * | 12/2022 | Kim | ........................ G06F 7/523 |

FOREIGN PATENT DOCUMENTS

| KR | 10-2017-0090981 | 8/2017 |
|---|---|---|
| KR | 10-1975534 B1 | 5/2019 |

OTHER PUBLICATIONS

Notice of Allowance for Korean Patent Application No. 10-2019-0053899, dated Jan. 12, 2021 (w/English translation).
Office Action for Korean Patent Application No. 10-2019-0053899, dated Jun. 30, 2020 (w/English translation).

* cited by examiner

| A | /A | B | /MAX | MAX |
|---|----|---|------|-----|
| 2 | 0 | 0 | 0 | 2 |
| 2 | 0 | 1 | 0 | 2 |
| 2 | 0 | 2 | 0 | 2 |
| 1 | 1 | 0 | 1 | 1 |
| 1 | 1 | 1 | 1 | 1 |
| 1 | 1 | 2 | 0 | 2 |
| 0 | 2 | 0 | 2 | 0 |
| 0 | 2 | 1 | 1 | 1 |
| 0 | 2 | 2 | 0 | 2 |

| A | /A | B | MIN |
|---|----|---|-----|
| 2 | 0  | 0 | 0   |
| 2 | 0  | 1 | 1   |
| 2 | 0  | 2 | 2   |
| 1 | 1  | 0 | 0   |
| 1 | 1  | 1 | 1   |
| 1 | 1  | 2 | 1   |
| 0 | 2  | 0 | 0   |
| 0 | 2  | 1 | 0   |
| 0 | 2  | 2 | 0   |

|  | BL1 | BL2 | WWL | RWL | EN | X1 | X2 |
|---|---|---|---|---|---|---|---|
| HOLD | float | float | GND | GND | GND | - | - |
| READ | float | precharge | GND | VDD | GND | - | VDD |
| WRITE | Q | float | VDD | GND | GND | - | - |
| MIN | float | precharge | GND | VDD | GND | - | X2 |
| MAX | float | GND | GND | GND | VDD | X1 | - |

TERNARY MEMORY CELL FOR LOGIC-IN-MEMORY AND MEMORY DEVICE COMPRISING SAME

CROSS REFERENCE TO RELATED APPLICATIONS

This is the U.S. National Stage of International Application No. PCT/KR2020/004560, filed Apr. 3, 2020, which in turn claims priority to Korean Patent Application No. 10-2019-0053899, filed May 8, 2019, which applications are incorporated herein in their entireties.

TECHNICAL FIELD

The present disclosure relates to a memory device, and more particularly, to a ternary memory cell for a logic-in-memory and a memory device including the same.

BACKGROUND ART

A ternary logic circuit has been proposed in Public Patent Publication No. 10-1689159 (referred to herein as 'the related art') of the same applicant, which is incorporated herein by reference in its entirety. For example, as a ternary logic circuit, when an inverter receives a ground voltage GND, an intermediate voltage VDD/2, and a positive supply voltage VDD respectively corresponding to ternary logic values, that is, 0/1/2 logic values, the inverter may output a positive supply voltage VDD, an intermediate voltage VDD/2, and a ground voltage GND respectively corresponding to 2/1/0 logic values. Such a ternary logic circuit may provide an advantage which is capable of processing a greater amount of information than a typical binary logic circuit using a ground voltage GND and a positive supply voltage VDD corresponding to 0/1 logic values, and may also be advantageous in a logic-in-memory structure that outputs a value obtained by performing a logic operation on stored data.

DESCRIPTION OF EMBODIMENTS

Technical Problem

The present disclosure provides a ternary memory cell and a memory device including the same, wherein the ternary memory cell is configured to perform a logic operation on ternary logic values stored in the memory device by using increased information processing capability of a ternary logic circuit and output a result of the logic operation.

Solution to Problem

To achieve the above-described objects, a memory device for a logic-in-memory according to an aspect of the present disclosure may include a cell array including a plurality of ternary memory cells, a row decoder configured to select at least one ternary memory cell from among the plurality of ternary memory cells, and a page buffer configured to provide a first value to the at least one ternary memory cell and latch a third value obtained by performing a logic operation on the first value and a second value stored in the at least one ternary memory cell and/or the second value. The at least one ternary memory cell may include a first inverter and a second inverter being cross-coupled in a first node corresponding to the second value and a second node corresponding to an inverted value of the second value and each including a pull-up device and a pull-down device, wherein the pull-up device and the pull-down device are configured to have a constant current pass therethrough upon turn-off, and a logic operation circuit including a P-channel transistor and an N-channel transistor and configured to output the third value, wherein the P-channel transistor and the N-channel transistor are configured to have the constant current pass therethrough upon turn-off.

According to an example embodiment of the present disclosure, the logic operation circuit may output an inverted value of the third value corresponding to a maximum value of the first value and the second value, which are ternary values.

According to an example embodiment of the present disclosure, the page buffer may provide an inverted value of the first value to the at least one ternary memory cell and latch the inverted value of the third value, the P-channel transistor may have a gate to which the second value is applied, a source to which the inverted value of the first value is applied, and a drain outputting the inverted value of the third value, and the N-channel transistor may have a gate to which the first value is applied, a sourced connected to a ground potential, and a drain outputting the inverted value of the third value.

According to an example embodiment of the present disclosure, the page buffer may latch the inverted value of the third value, the P-channel transistor may have a gate to which the first value is applied, a source to which an inverted value of the second value is applied, and a drain outputting the inverted value of the third value, and the N-channel transistor may have a gate to which the first value is applied, a sourced connected to a ground potential, and a drain outputting the inverted value of the third value.

According to an example embodiment of the present disclosure, the logic operation circuit may include a pull-up device and a pull-down device which are configured to have the constant current pass therethrough upon turn-off and may include an inverter which is selectively enabled, wherein the inverter may receive the second value and provide the inverted value of the second value to the P-channel transistor when being enabled.

According to an example embodiment of the present disclosure, the logic operation circuit may output the third value corresponding to a minimum value of the first value and the second value, which are ternary values.

According to an example embodiment, the P-channel transistor may have a gate to which an inverted value of the second value is applied, a source to which the first value is applied, and a drain outputting the third value, and the N-channel transistor may have a gate to which the inverted value of the second value is applied, a source to which a ground potential is applied, and a drain outputting the third value.

According to an example embodiment of the present disclosure, the page buffer may provide an inverted value of the first value to the at least one ternary memory cell, the P-channel transistor may have a gate to which the inverted value of the first value is applied, a source to which the second value is applied, and a drain outputting the third value, and the N-channel transistor may have a gate to which the inverted value of the first value is applied, a source to which a ground potential is applied, and a drain outputting the third value.

According to an example embodiment of the present disclosure, the page buffer may apply the second value and an inverted value of the second value to a pair of bit lines connected to the at least one ternary memory cell in a write operation and latch the third value through an output line connected to the at least one ternary memory cell in a read operation.

According to an embodiment of the present disclosure, the page buffer may be configured to apply the second value and an inverted value of the second value to a pair of bit lines connected to the at least one ternary memory cell in a write operation and latch the third value through at least one of the pair of bit lines in a read operation.

According to an example embodiment of the present disclosure, the page buffer may apply the second value or an inverted value of the second value to a first bit line connected to the at least one ternary memory cell in a write operation and latch the third value through a second bit line connected to the at least one ternary memory cell in a read operation.

According to an example embodiment of the present disclosure, the pull-up device may have a same structure as that of the P-channel transistor, and the pull-down device may have a same structure as that of the N-channel transistor.

A memory device for a logic-in-memory according to an aspect of the present disclosure may include a cell array including a plurality of ternary memory cells storing a ternary value, wherein each of the plurality of ternary memory cells may include a logic operation circuit configured to generate an inverted value of a third value corresponding to a maximum value of a first value provided to the ternary memory cell and a second value stored in the ternary memory cell, wherein the logic operation circuit may include a P-channel transistor and an N-channel transistor, wherein the P-channel transistor and the N-channel transistor may be configured to have a constant current pass therethrough and have a drain outputting the inverted value of the third value, wherein the P-channel transistor may have a gate and a source to which the first value and an inverted value of the second value are applied, respectively, or have a gate and a source to which the second value and an inverted value of the first value are applied, respectively, and, the N-channel transistor may have a gate and a source to which the first value and a ground potential are applied, respectively, or have a gate and a source to which the second value and the ground potential are applied, respectively.

A memory device for a logic-in-memory according to an aspect of the present disclosure may include a cell array including a plurality of ternary memory cells storing a ternary value, wherein each of the plurality of ternary memory cells may include a logic operation circuit configured to generate a third value corresponding to a minimum value of a first value provided to the ternary memory cell and a second value stored in the ternary memory cell, wherein the logic operation circuit may include a P-channel transistor and an N-channel transistor, wherein the P-channel transistor and the N-channel transistor may be configured to have a constant current pass therethrough and have a drain outputting an inverted value of the third value, wherein the P-channel transistor may have a gate and a source to which an inverted value of the first value and the second value are applied, respectively, or have a gate and a source to which an inverted value of the second value and the first value are applied, respectively, and the N-channel transistor may have a gate and a source to which the inverted value of the first value and a ground potential are applied, respectively, or have a gate and a source to which the inverted value of the second value and the ground potential are applied, respectively.

Advantageous Effects of Disclosure

According to a ternary memory cell according to an example embodiment of the present disclosure and a memory device including the same, a logic-in-memory structure that stores ternary logic values and provides ternary logic operations thereon may be provided.

In addition, according to a ternary memory cell according to an example embodiment of the present disclosure and a memory device including the same, logic operations outside the memory device may be significantly reduced by performing logic operations on increased information stored in the ternary memory cell inside the memory device.

Effects which may be obtained in example embodiments of the present disclosure are not limited to the above-mentioned effects, and other effects not mentioned may be clearly derived and understood by those of ordinary skill in the art to which example embodiments of the present disclosure pertain from the following description. That is, unintended effects according to the practice of the example embodiments of the present disclosure may also be derived by those of ordinary skill in the art from the example embodiments of the present disclosure.

MODE OF DISCLOSURE

Figure 1:
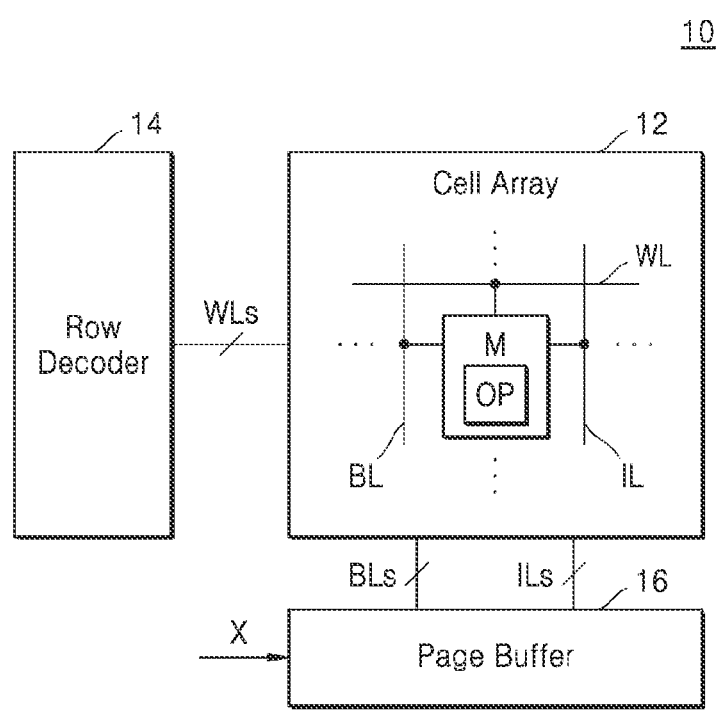
FIG. 1 is a block diagram of a memory device according to an example embodiment of the present disclosure.

Hereinafter, embodiments of the inventive concept will be described in detail with reference to the accompanied drawings. Embodiments of the present disclosure are provided so that this disclosure will be through and complete, and will fully convey the concept of the present disclosure to those skilled in the art. As the present disclosure allows for various changes and numerous embodiments, particular embodiments will be illustrated in the drawings and described in detail in the written description. However, this is not intended to limit the present disclosure to particular modes of practice, and it is to be appreciated that all changes, equivalents, and substitutes that do not depart from the spirit and technical scope are encompassed in the present disclosure. Like reference numerals in the drawings denote like elements. Sizes of components in the drawings may be exaggerated or reduced for convenience of explanation.

Specific language has been used to describe particular embodiments in the present specification, but the present disclosure is not limited thereto. An expression used in the singular encompasses the expression of the plural, unless it has a clearly different meaning in the context. In the present specification, it is to be understood that the terms such as "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Unless defined otherwise, all terms used herein, including technical or scientific terms, have the same meaning as commonly understood by one of ordinary skill in the art to which the present disclosure belongs. Terms such as those defined in a commonly used dictionary should be interpreted as having a meaning consistent with the meaning in the context of the related art, and are not interpreted in an ideal or excessively formal meaning unless explicitly defined in the present disclosure.

FIG. 1 is a block diagram of a memory device 10 according to an example embodiment of the present disclosure. In particular, FIG. 1 shows a cell array 12, a row decoder 14, and a page buffer 16 as some components included in the memory device 10.

The memory device 10 may receive a command or an address from the outside, and may receive or output data. For example, the memory device 10 may receive a command such as a write command and a read command, and an address corresponding to the command. The memory device 10 may receive data in response to the write command, and may output data in response to the read command.

In some embodiments, a command, an address, and data may be received or transmitted through independent channels, and in some embodiments, at least two of a command, an address, and data may be received or transmitted through the same channel. In some embodiments, the memory device 10 may refer to any device manufactured through a semiconductor process. For example, the memory device 10 may be packaged as an independent memory device, or may be included in a semiconductor package such as a system-on-chip or a processor.

The cell array 12 may include a plurality of memory cells (e.g., M). A memory cell M may have three different states, and thus may store ternary logic values corresponding to the three different states, and accordingly, may be referred to as a ternary memory cell. Herein, the ternary logic values that the memory cell M may store may be referred to as '0', '1', and '2', may collectively referred to as '0/1/2', or may be simply referred to as ternary values. In some embodiments, as will be described below with reference to FIG. 2, the memory device 10 may be a static random access memory (SRAM), and may include a ternary logic circuit or a ternary logic device proposed in the related art. An example of the memory cell M will be described below with reference to FIG. 2 or the like. As described above, the SRAM including memory cells capable of storing ternary logic values may be referred to as a ternary SRAM or a T-SRAM.

The cell array 12 may be connected to the row decoder 14 through a plurality of word lines WLs, and may be connected to the page buffer 16 through a plurality of bit lines BLs and a plurality of input lines ILs. Although not shown in FIG. 1, in some embodiments, the memory device 10 may further include a column decoder being arranged between the cell array 12 and the page buffer 16 and selecting some of the plurality of bit lines BLs and/or the plurality of input lines ILs connected to the cell array 12 according to an address. Herein, the memory device 10 will be mainly described with reference to a structure in which the column decoder is omitted as shown in FIG. 1, but embodiments of the present disclosure are not limited thereto.

As shown in FIG. 1, the memory cell M may be coupled to one word line WL from among the plurality of word lines WLs. In addition, the memory cell M may be coupled to at least one bit line BL from among the plurality of bit lines BLs. The memory cell M may have a structure for storing a ternary logic value provided through the at least one bit line BL. For example, as will be described below with reference to FIGS. 2 and 3, the memory cell M may include a pair of inverters which are cross-coupled, and each of the inverters may include a pull-up device and a pull-up device which are configured to have a constant current pass therethrough upon turn-off.

The memory device 10 may have a logic-in-memory (LIM) structure. An LIM may refer to a memory that outputs a result of performing a logic operation on values stored in a memory device, and may also be referred to as a logic operation circuit on which a memory function is mounted. For example, as shown in FIG. 1, the memory cell M may include a logic operation circuit OP, and may be connected to at least one input line IL from among the plurality of input lines ILs. The logic operation circuit OP may perform a logic operation on a ternary value (herein, may be referred to as a second value) stored in the memory cell M and a ternary value (herein, may be referred to as a first value) provided from the page buffer 16 through the at least one input line IL, and provide a result value (herein, referred to as a third value) of the logic operation to the page buffer 16. The page buffer 16 may latch a value to be stored in a write operation and a value read in a read operation, as well as a result value of a logic operation. Herein, the write operation may refer to an operation for storing data (or values) in the memory cell M, the read operation may refer to an operation for outputting data stored in the memory cell M to the outside of the memory device 10, and the logical operation may refer to an operation for outputting result data obtained by performing a logic operation on the data stored in the memory cell M in the memory device 10 to the outside of the memory device 10.

As will be described below with reference to the drawings, the logic operation circuit OP may have a simple structure for performing a ternary logic operation on a ternary value stored in the memory cell M, and accordingly, the memory device 10 may not only have an increased capacity due to the memory cell M storing a ternary value, but may also realize an LIM for ternary logic operations by performing ternary logic operations on an increased amount of data, thereby shortening time required for a logic operation of a ternary value stored in the memory cell M and significantly reducing logic devices (e.g., ternary logic devices) outside the memory device 10.

The row decoder 14 may activate one of the plurality of word lines WLs according to an address received along with a write command or a read command. For example, when the word line WL is activated, the memory cell M may be selected, a ternary value may be written into the memory cell M by voltages and/or currents of at least one bit line BL in a read operation, and voltages and/or currents according to a ternary value stored in the memory cell M may be provided to the at least one bit line BL in a write operation. Memory cells connected to the same write word line (or the same read word line) or data stored in such memory cells may be referred to as a page.

The page buffer 16 may be connected to the cell array 12 through the plurality of bit lines BLs. The page buffer 16 may include at least one latch, may latch data to be written into the cell array 12, that is, write data, in a write operation, and may latch data read from the cell array 12, that is, read data, in a read operation. The page buffer 16 may include a write circuit, and the write circuit may apply voltages and/or currents based on write data to the plurality of bit lines BLs in a write operation. In addition, the page buffer 16 may include a read circuit, and the read circuit may generate read data by sensing voltages and/or currents of the plurality of bit lines BLs in a read operation. For example, the page buffer 16 may precharge the at least one bit line BL to a constant voltage before the word line WL is activated by the row decoder 14 in the read operation, and when the word line WL is activated, the page buffer 16 may determine ternary logic values by sensing a voltage and/or current of the at least one bit line BL. The page buffer 16 may include ternary logic devices, and accordingly, the page buffer 16 may write ternary logic values into the memory cell M or read the ternary values from the memory cell M.

The page buffer 16 may be connected to the cell array 12 through the plurality of input lines ILs. The page buffer 16 may receive a plurality of ternary values X to be logically operated with a ternary value stored in a memory device (e.g., M) selected by the row decoder 14, and provide the plurality of ternary values X to the cell array 12 through the plurality of input lines ILs. For example, the logic operation circuit OP included in the memory cell M may receive at least one ternary value through the at least one input line IL, and perform a logic operation on a ternary value stored in the memory cell M and the at least one ternary value. The page buffer 16 may provide the plurality of ternary values X to the cell array 12 through the plurality of input lines ILs in some embodiments, and may also provide result values obtained by performing ternary logic operations on the plurality of ternary values X to the cell array 12 through the plurality of input lines ILs in some embodiments.

Figure 2:
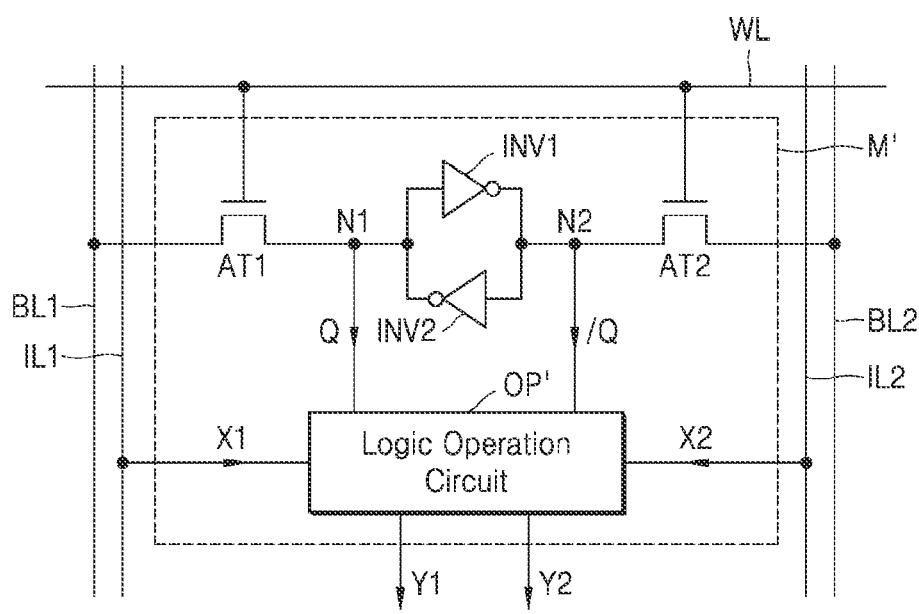
FIG. 2 is a circuit diagram illustrating an example of the memory cell of FIG. 1, according to an example embodiment of the present disclosure.

FIG. 2 is a circuit diagram illustrating an example of the memory cell M of FIG. 1, according to an example embodiment of the present disclosure. As described above with reference to FIG. 1, a memory cell M' of FIG. 2 may be connected to the word line WL, may be connected to a first bit line BL1 and a second bit line BL2 as the at least one bit line BL, and may be connected to a first input line IL1 and a second input line IL2 as the at least one input line IL. The memory cell M' may store one logic value from among ternary logic values, that is, 0/1/2, and hereinafter, FIG. 2 will be described with reference to FIG. 1.

Referring to FIG. 2, the memory cell M'' may include a first inverter INV1, a second inverter INV2, a first access transistor AT1, a second access transistor AT2, and a logic operation circuit OP'. The first inverter INV1 and the second inverter INV2 may be cross-coupled in a first node N1 and a second node N2, and thus, may store one logic value from among 0/1/2. Herein, when a first node N1 is a positive supply voltage VDD and a second node N2 is a ground voltage GND (or a negative supply voltage VSS), the memory cell M' may be referred to as storing a logic value 2 (Q=2). In addition, herein, when the first node N1 and the second node N2 are an intermediate voltage (e.g., VDD/2) (or (VDD+VSS)/2), the memory cell M' may be referred to as storing a logic value 1 (Q=1). In addition, herein, when the first node N1 is the ground voltage GND (or the negative supply voltage VSS) and the second node N2 is the positive supply voltage VDD, the memory cell M' may be referred to as storing a logic value 0 (Q=0). Examples of operations of the first inverter INV1 and the second inverter INV2 will be described below with reference to FIGS. 3 and 4.

The first access transistor AT1 may be connected to the first node N1 and the first bit line BL1, and may have a gate (or a control terminal) connected to the word line WL. The first access transistor AT1 may electrically connect or disconnect the first node N1 and the first bit line BL1 according to a voltage of the word line WL. For example, the first access transistor AT1 may be an N-channel field effect transistor (NFET), which may electrically connect the first node N1 to the first bit line BL1 in response to the word line WL which is activated, that is, a high level of voltage of the word line WL, and may electrically disconnect the first node N1 and the first bit line BL1 in response to the word line WL which is inactivated, that is, a low level of voltage of the word line WL. Similar to the first access transistor AT1, the second access transistor AT2 may be connected to the second node N2 and the second bit line BL2, and may have a gate (or a control terminal) connected to the word line WL. Herein, embodiments of the present disclosure will be described assuming that the first access transistor AT1 and the second access transistor AT2 are NFETs, but the embodiments of the present disclosure may also be applied even to a case where the first access transistor AT1 and the second access transistor AT2 are P-channel field effect transistors (PFETs).

The logic operation circuit OP' may be connected to the first node N1 and the second node N2, and may be connected to the first input line IL1 and the second input line IL2. Accordingly, the logic operation circuit OP may receive a value Q (hereinafter, may be referred to as a storage value) stored in the memory cell M and an inverted value /Q of the storage value, and may receive a first input value X1 and a second input value X2. The logic operation circuit OP may generate a first output value Y1 and a second output value Y2 by performing a logic operation on two or more of received values (i.e., Q, /Q, X1, X2). The first output value Y1 and the second output value Y2 may be provided to the page buffer 16 of FIG. 1 in various ways. In some embodiments, the logic operation circuit OP' may receive only one of the storage value Q and the inverted value /Q of the storage value, different from that shown in FIG. 2. In addition, in some embodiments, the logic operation circuit OP' may also receive one or three or more input values, different from that shown in FIG. 2. In addition, the logic operation circuit OP may also generate one or three or more output values, different from that shown in FIG. 2. Examples of the logic operation circuit OP will be described below with reference to FIGS. 6 and 8.

Figure 3:
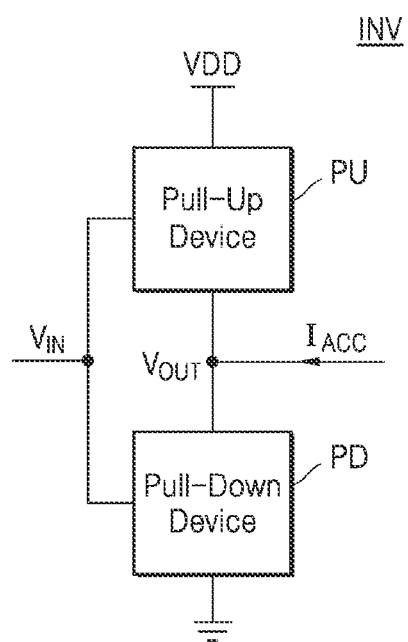
FIG. 3 is a circuit diagram illustrating an example of an inverter of FIG. 2 according to an example embodiment of the present disclosure.
Figure 4:
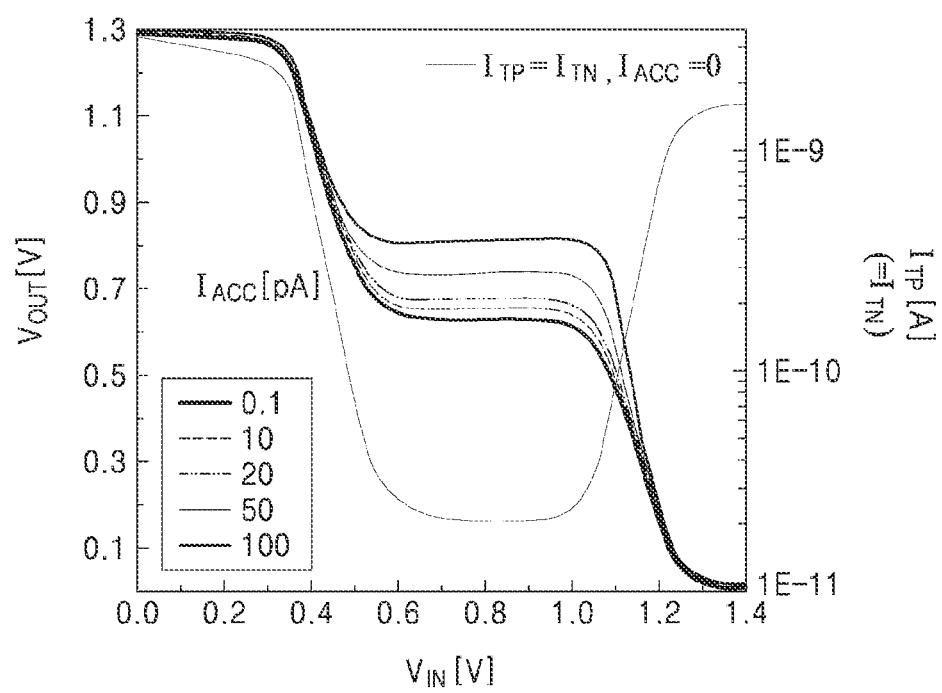
FIG. 4 is a graph showing an example of an operation of the inverter of FIG. 3 according to an example embodiment of the present disclosure.

FIG. 3 is a circuit diagram illustrating an example of the inverter of FIG. 2 according to an example embodiment of the present disclosure, and FIG. 4 is a graph showing an example of an operation of an inverter INV of FIG. 3 according to an example embodiment of the present disclosure. In particular, FIG. 3 shows an inverter generating an output voltage $V_{OUT}$ by inverting an input voltage $V_{IN}$, and the graph of FIG. 4 shows input voltage $V_{IN}$-output voltage $V_{OUT}$ characteristics and input voltage $V_{IN}$-through currents $I_{TP}$ and $I_{TN}$ characteristics. In the graph of FIG. 4, the horizontal axis represents the input voltage $V_{IN}$, the left vertical axis represents the output voltage $V_{OUT}$, and the right vertical axis represents the through currents $I_{TP}$ and $I_{TN}$ on a logarithmic scale. In the graph of FIG. 4, values shown on the horizontal axis and the vertical axes are only examples in which the positive supply voltage VDD is 1.4 V. and characteristics shown in the graph may also appear even at values different from those shown in FIG. 4. Hereinafter, FIGS. 3 and 4 are described with reference to FIG. 2.

Referring FIG. 3, the inverter INV may include a pull-up device PU and a pull-down device PD connected in series between the positive supply voltage VDD and the ground voltage GND (or the negative supply voltage VSS). The pull-up device PU may be turned off in response to the input voltage $V_{IN}$ having a high level, for example, the positive supply voltage VDD, and may be turned on in response to the input voltage $V_{IN}$ having a low level, for example, the ground voltage GND. On the other hand, the pull-down device PD may be turned off in response to the input voltage $V_{IN}$ having a low level, for example, the ground voltage GND, and may be turned on in response to the input voltage $V_{IN}$ having a high level, for example, the positive supply voltage VDD. Accordingly, similar to a binary logic circuit, the output voltage $V_{OUT}$ having a low level (e.g., GND) may be output in response to the input voltage $V_{IN}$ having a high level (e.g., VDD), and the output voltage $V_{OUT}$ having a high level (e.g., VDD) may be output in response to the input voltage $V_{IN}$ having a low level (e.g., GND).

Figure 6:
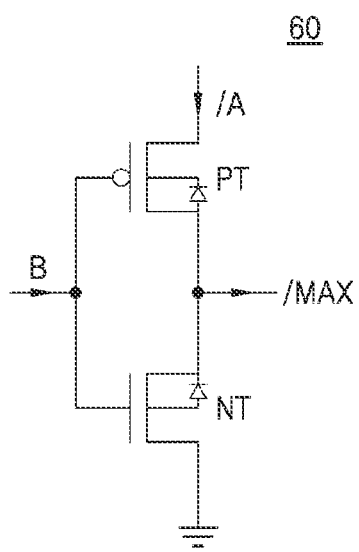
FIG. 6 is a diagram showing an example of a logic operation circuit according to an example embodiment of the present disclosure.

The pull-up device PU and the pull-down device PD may have a constant current pass therethrough when being turned off. That is, the through current $I_{TP}$ of the pull-up device PU may be constant in a state in which the pull-up device PU is turned off, and the through current $I_{TN}$ of the pull-down device PD may also be constant in a state in which the pull-down device PD is turned off. In addition, a threshold voltage of the pull-up device PU may be lower than a threshold voltage of the pull-down device PD. Accordingly, when the input voltage $V_{IN}$ gradually increases from the ground voltage GND to the positive supply voltage VDD, the pull-up device PU may be turned off and then the pull-down device PD may be turned on. Therefore, both of the pull-up device PU and the pull-down device PD may be turned off between about 0.6 V to about 1.1 V, as in the input voltage $V_{IN}$-output voltage $V_{OUT}$ characteristics shown in FIG. 4. In some embodiments, as shown in FIG. 6 or the like, the pull-up device PU and the pull-down device PD may respectively be a P-channel transistor and an N-channel transistor which are configured to have the constant current pass therethrough upon turn-off.

As in the input voltage $V_{IN}$-through currents $I_{TP}$ and $I_{TN}$ characteristics shown in FIG. 4, when there is no current (i.e., $I_{ACC}$) applied to an output terminal of the inverter INV, magnitudes of the through current $I_{TP}$ of the pull-up device PU and the through current $I_{TN}$ of the pull-down device PD may match, and the through currents $I_{TP}$ and $I_{TN}$ may be constantly maintained at a low level between about 0.6 V and about 1.1 V. As a result, the output voltage $V_{OUT}$ may be maintained substantially constant at about 0.6 V and about 1.1 V due to the through current $I_{TP}$ of the pull-up device PU and the through current $I_{TN}$ of the pull-down device PD. That is, when the input voltage $V_{IN}$, for example, about half (VDD/2) of the positive supply voltage VDD is provided, the inverter INV may output the output voltage $V_{OUT}$ having an intermediate level, for example, about half (VDD/2) of the positive supply voltage VDD. Accordingly, when the ground voltage GND, an intermediate voltage VDD/2, and the positive supply voltage VDD respectively corresponding to the 0/1/2 logic values are input to the inverter INV, the inverter INV may output the positive supply voltage VDD, the intermediate voltage VDD/2, and the ground voltage GND respectively corresponding to the 2/1/0 logic values. Herein, the 'intermediate voltage' is assumed to be half (VDD/2) of the positive supply voltage VDD, but may be understood as a voltage having any level between the positive supply voltage VDD and the ground voltage GND.

In a case of the SRAM including two inverters which are cross-coupled, it may be required to have a characteristic that does not change a value stored in a memory cell in a read operation, for example, a high read SNM. Referring to FIG. 4, the inverter INV of FIG. 3 may provide a high read SNM despite an increase in an access current $I_{ACC}$ (e.g., despite the access current $I_{ACC}$ being higher than the through currents $I_{TP}$ and $I_{TN}$).

Figure 5:
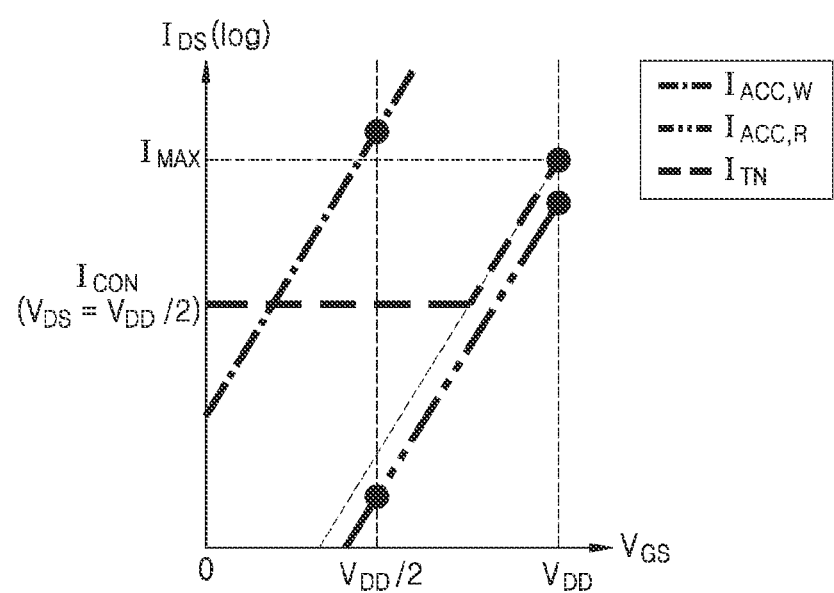
FIG. 5 is a graph showing characteristics of an access current of FIG. 3, according to an example embodiment of the present disclosure.

FIG. 5 is a graph showing characteristics of the access current $I_{ACC}$ of FIG. 3, according to an example embodiment of the present disclosure. In particular, FIG. 5 shows characteristics of such a transistor when the pull-down device PD of FIG. 3 is a transistor having a source, a drain, and a gate, and making a constant current to pass therethrough when being turned off, and shows characteristics of access currents $I_{ACC, W}$ and $I_{ACC, R}$ respectively in a read operation and a write operation. Hereinafter, FIG. 5 is described with reference to FIG. 3.

As described above with reference to FIG. 2, the memory cell M' may include the first inverter INV1 and the second inverter INV2 which are cross-coupled, and accordingly, a relatively high current may be applied to the first inverter INV1 and the second inverter INV2 to change a value stored in the memory cell M' in a write operation, and a relatively low current may be applied to the first inverter INV1 and the second inverter INV2 so as not to change a value stored in the memory cell M' in a read operation. That is, as described in FIG. 3, when a current applied from the outside to the output terminal of the inverter INV is defined as the access current $I_{ACC}$, the access current $I_{ACC, W}$ applied to the inverter INV in a write operation and the access current $I_{ACC, R}$ applied to the inverter INV in a read operation may satisfy [Equation 1] below.

$$I_{ACC,W} > I_T, I_{ACC,R} < I_T \qquad \text{[Equation 1]}$$

In [Equation 1], $I_T$ may correspond to a larger current among the through current $I_{TP}$ of the pull-up device PU and the through current $I_{TN}$ of the pull-down device PD in a write operation ($I_T$=max($I_{PP}$, $I_{TN}$)), and may correspond to a smaller current among the through current $I_{TP}$ of the pull-up device PU and the through current $I_{TN}$ of the pull-down device PD in a read operation ($I_T$=min($I_{TP}$, $I_{TN}$)).

Referring to FIG. 5, as indicated by a dashed line, the through current $I_{TN}$ of the pull-down device PD may have a magnitude '$I_{CON}$' at the intermediate voltage VDD/2 and a gate-source voltage Vs below the same, gradually increase after the pull-down device PD is turned on as the gate-source voltage $V_{GS}$ increases, and have a magnitude '$I_{MAX}$' when the gate-source voltage $V_{GS}$ reaches the positive supply voltage VDD.

In a write operation, the access current $I_{ACC, W}$ may have a relatively large magnitude, and in some embodiments, when the access current $I_{ACC, W}$ is provided by a transistor (e.g., WT1 of FIG. 2), as indicated by the one-dot dashed line of FIG. 5, the transistor may provide the access current $I_{ACC, W}$ having a magnitude greater than the magnitude '$I_{MAX}$' at the intermediate voltage VDD/2. In addition, in a read operation, the access current $I_{ACC, R}$ may have a relatively small magnitude, and in some embodiments, when the access current $I_{ACC, R}$ is provided by a transistor, as indicated by the two-dot dashed line of FIG. 5, the transistor may provide the access current $I_{ACC, R}$ having a magnitude less than that of the through current $I_{TN}$ of the pull-down device PD at the intermediate voltage VDD/2 and less than the magnitude '$I_{MAX}$' at the positive supply voltage VDD. That is, transistors providing the access current $I_{ACC}$ may be designed to have the same or similar characteristics to that of the graph shown in FIG. 5.

FIG. 6 is a diagram showing an example of a logic operation circuit according to an example embodiment of the present disclosure. In particular, the left side of FIG. 6 is a circuit diagram of a logic operation circuit 60, and the right side of FIG. 6 is a table showing operations of the logic operation circuit 60.

In some embodiments, the logic operation circuit 60 may generate a maximum value with respect to two ternary values. For example, as shown in FIG. 6, the logic operation circuit 60 may include a P-channel transistor PT and an N-channel transistor NT which are configured to have the constant current pass therethrough upon turn-off. The P-channel transistor PT may have a gate receiving a second input B, a source receiving an inverted first input/A, and a drain outputting an inverted maximum value/MAX. The N-channel transistor N may have a gate receiving the second input B, a source connected to a ground potential (or a negative supply voltage), and a drain outputting the inverted maximum value/MAX. The P-channel transistor PT may have characteristics of the pull-up device PU described above with reference to FIGS. 3 to 5, and the N-channel transistor N may have characteristics of the pull-down device PD described above with reference to FIGS. 3 to 5. Accordingly, as shown in the table on the right side of FIG. 6, the logic operation circuit 60 may output the inverted maximum value/MAX obtained by inverting a maximum value MAX of a first input A and the second input B.

In some embodiments, when the inverted first input/A is '1', to compensate for a voltage drop of the inverted maximum value/MAX, the logic operation circuit 60 may further include an inverter having the inverted maximum value/MAX as an input, and an output of the inverter, which is further included, may correspond to the maximum value MAX. For example, In the inverter which is further included, a size ratio and/or a threshold voltage of a pull-up device and a pull-down device may be determined such that a range of an input voltage corresponding to the logic value '1' is adjusted to be low. In addition, in some embodiments, when the inverted first input/A is the logic value '1', to compensate for a voltage level drop of the inverted maximum value/MAX, an inverter having the inverted first input/A as an output may be further included, and an input of the inverter, which is further included, may correspond to the first input A. For example, in the inverter which is further included, a size ratio and/or a threshold voltage of a pull-up device and a pull-down device may be determined such that a range of an output voltage corresponding to the logic value '1' is adjusted to be high.

Figure 7A:
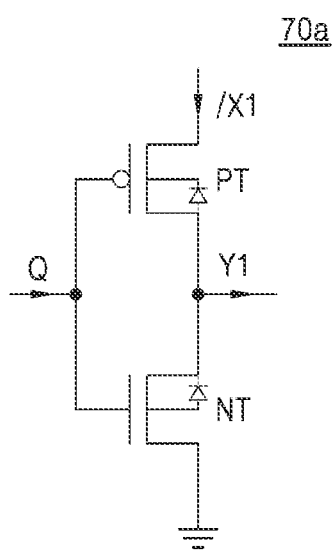
FIGS. 7A and 7B are circuit diagrams each illustrating an example of the logic operation circuit of FIG. 6 applied to a memory cell, according to example embodiments of the present disclosure.
Figure 7B:
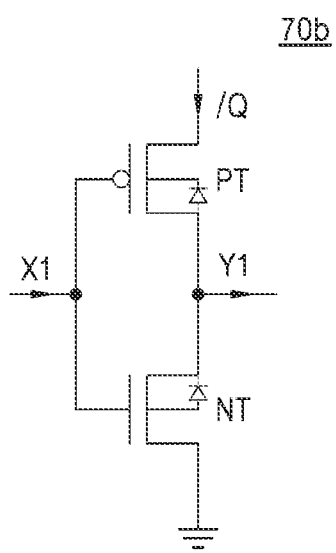

FIGS. 7A and 7B are circuit diagrams each illustrating an example of the logic operation circuit 60 of FIG. 6 applied to a memory cell, according to example embodiments of the present disclosure. In particular, FIGS. 7A and 7B are circuit diagrams respectively illustrating logic operation circuits 70a and 70b generating the first output value Y1 from the storage value Q in the memory cell M of FIG. 2 and the first input value X1. As described above with reference to FIG. 6, the logic operation circuits 70a and 70b of FIGS. 7A and 7B may output an inverted value of a maximum value of the storage value Q and the first input value X1 as the first output value Y1. Hereinafter, in the descriptions of FIGS. 7A and 7B, descriptions already given with reference to FIG. 6 will be omitted, and FIGS. 7A and 7B will be described with reference to FIG. 2.

Referring to FIG. 7A, in some embodiments, the P-channel transistor PT may have a gate to which the storage value Q is applied, a source to which an inverted value/X1 of the first input value X1 is applied, and a drain outputting the first output value Y1. In addition, the N-channel transistor NT may have a gate to which the storage value Q is applied, a source to which a ground potential is applied, and a drain outputting the first output value Y1. Accordingly, the first output value Y1 may have a value obtained by inverting a maximum value of the storage value Q and the first input value X1. To this end, the page buffer 16 of FIG. 1 may provide the inverted value/X1 of the first input value X1 through the first input line IL1, and may obtain the maximum value of the storage value Q and the first input value X1 by latching and inverting the first output value Y1.

Referring to FIG. 7B, in some embodiments, the P-channel transistor PT may have a gate to which the first input value X1 is applied, a source to which an inverted storage value/Q is applied, and a drain outputting the first output value Y1. In addition, the N-channel transistor NT may have a gate to which the first input value X1 is applied, a source to which a ground potential is applied, and a drain outputting the first output value Y1. Accordingly, the first output value Y1 may have a value obtained by inverting a maximum value of the storage value Q and the first input value X1. To this end, the page buffer 16 of FIG. 1 may provide the first input value X1 through the first input line IL1, and may obtain the maximum value of the storage value Q and the first input value X1 by latching and inverting the first output value Y1.

Figure 8:
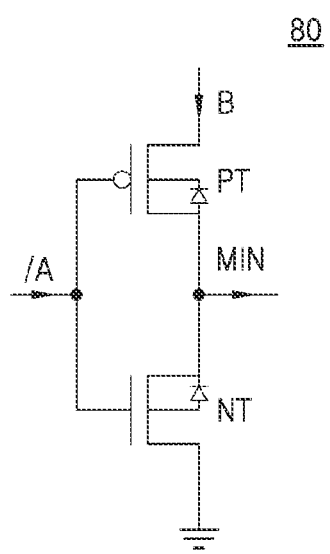
FIG. 8 is a diagram showing an example of a logic operation circuit according to an example embodiment of the present disclosure.

FIG. 8 is a diagram showing an example of a logic operation circuit according to an example embodiment of the present disclosure. In particular, the left side of FIG. 8 is a circuit diagram of a logic operation circuit 80, and the right side of FIG. 8 is a table showing operations of the logic operation circuit 80.

In some embodiments, the logic operation circuit 80 may output a minimum value with respect to two ternary values. For example, as shown in FIG. 8, the logic operation circuit 80 may include a P-channel transistor PT and an N-channel transistor NT which are configured to have the constant current pass therethrough upon turn-off. The P-channel transistor PT may have a gate receiving the inverted first input/A, a source receiving the second input B, and a drain outputting a minimum value MIN. The N-channel transistor NT may have a gate receiving the inverted first input/A, a source connected to a ground potential (or a negative supply voltage), and a drain outputting the minimum value MIN. The P-channel transistor PT and the N-channel transistor NT may respectively have characteristics of the pull-up device PU and the pull-down device PD described above with reference to FIGS. 3 to 5. Accordingly, as shown in the table on the right side of FIG. 8, the logic operation circuit 80 may output the minimum value MIN of the first input A and the second input B.

In some embodiments, when the second input B is '1', to compensate for a voltage level drop of the minimum value MIN, the logic operation circuit 80 may further include an inverter having the minimum value MIN as an input, and an output of the inverter, which is further included, may correspond to an inverted minimum value/MIN. For example, in the inverter which is further included, a size ratio and/or a threshold voltage of a pull-up device and a pull-down device may be determined such that a range of an input voltage corresponding to the logic value '1' is adjusted to be low. In addition, in some embodiments, when the second input B is the logic value '1', to compensate for a voltage level drop of the minimum value MIN, an inverter having the second input B as an output may be further included, and an output of the inverter which is further included may correspond to an inverted second input/B. For example, in the inverter which is further included, a size ratio and/or a threshold voltage of a pull-up device and a pull-down device may be determined such that a range of an output voltage corresponding to the logic value '1' is adjusted to be high.

Figure 9A:
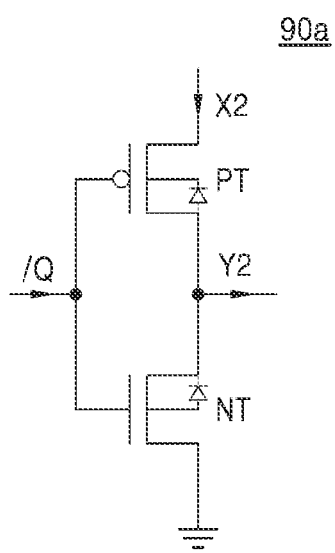
FIGS. 9A and 9B are circuit diagrams each illustrating an example of the logic operation circuit of FIG. 8 applied to a memory cell, according to example embodiments of the present disclosure.
Figure 9B:
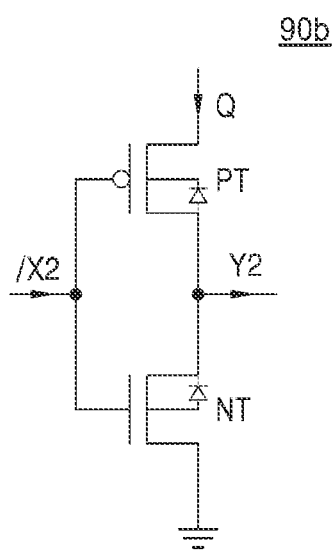

FIGS. 9A and 9B are circuit diagrams each illustrating an example of the logic operation circuit 80 of FIG. 8 applied to a memory cell, according to example embodiments of the present disclosure. In particular, FIGS. 9A and 9B are circuit diagrams respectively illustrating logic operation circuits 90a and 90b generating the second output value Y2 from the storage value Q in the memory cell M' of FIG. 2 and the second input value X2. As described above with reference FIG. 8, the logic operation circuits 90a and 90b of FIGS. 9A and 9B may output a minimum value of the storage value Q and the second input value X2 as the second output value Y2. Hereinafter, in the descriptions of FIGS. 9A and 9B, descriptions already given with reference to FIG. 8 will be omitted, and FIGS. 9A and 9B will be described with reference to FIG. 2.

Referring to FIG. 9A, in some embodiments, the P-channel transistor PT may have a gate to which the inverted storage value/Q is applied, a source to which the second input value X2 is applied, and a drain outputting the second output value Y2. In addition, the N-channel transistor NT may have a gate to which the inverted storage value/Q is applied, a source connected to a ground potential (or a negative supply voltage), and a drain outputting the second output value Y2. Accordingly, the second output value Y2 may have a minimum value of the storage value Q and the second output value Y2. To this end, the page buffer 16 of FIG. 1 may provide the second input value X2 through the second input line IL2, and may obtain the second output value Y2 as the minimum value of the storage value Q and the second input value X2.

Referring to FIG. 9B, in some embodiments, the P-channel transistor PT may have a gate to which an inverted second input value/X2 is applied, a source to which the storage value Q is applied, and a drain outputting the second output value Y2. In addition, the N-channel transistor NT may have a gate to which the inverted second input value/X2 is applied, a source connected to a ground potential (or a negative supply voltage), and a drain outputting the second output value Y2. Accordingly, the second output value Y2 may have the minimum value of the storage value Q and the second input value X2. To this end, the page buffer 16 of FIG. 1 may provide the inverted value/X2 of the second input value X2 to the second input line IL2, and may obtain the second output value Y2 as the minimum value of the storage value Q and the second input value X2.

Figure 10A:
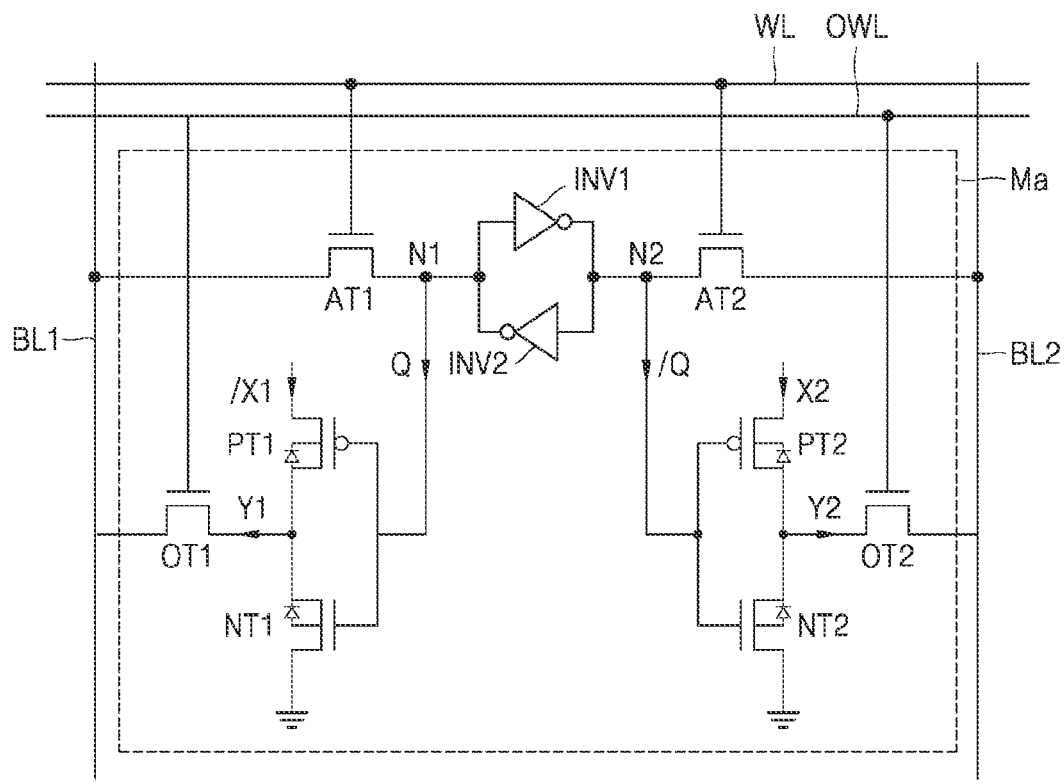
FIGS. 10A and 10B each show an example of a memory cell according to an example embodiment of the present disclosure.
Figure 10B:
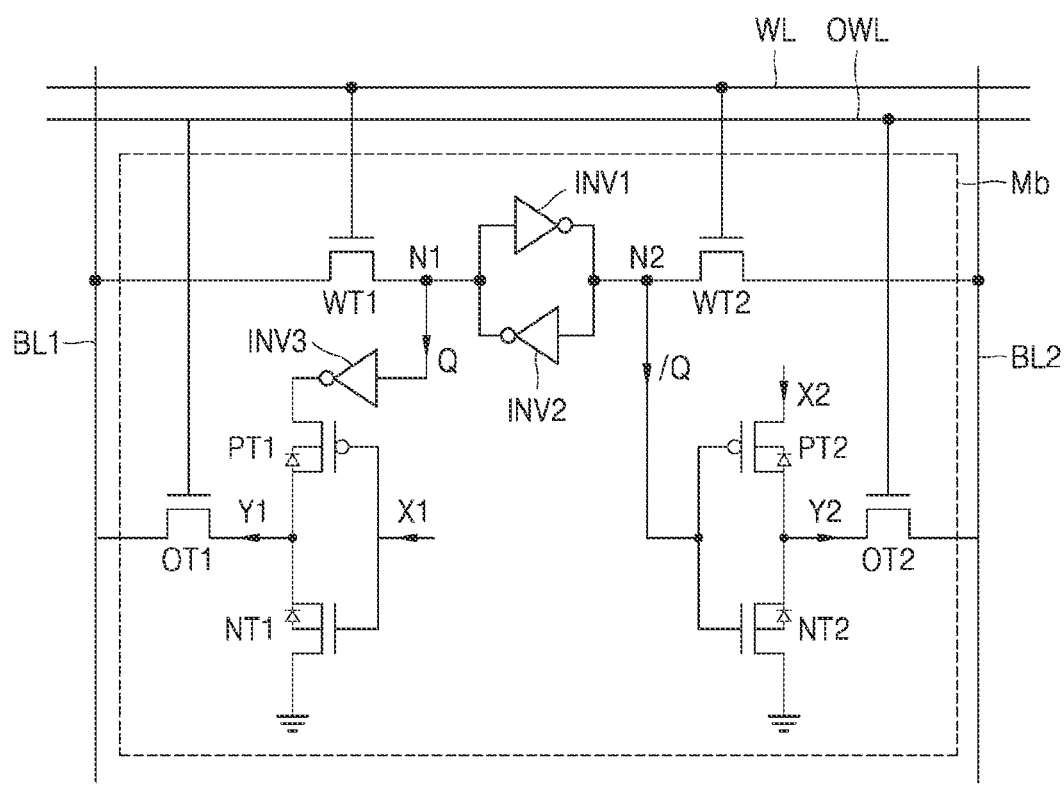

FIGS. 10A and 10B each show an example of a memory cell according to an example embodiment of the present disclosure. In particular, FIGS. 10A and 10B show examples of a memory cell controlled by an output word line OWL. Hereinafter, in the descriptions of FIGS. 10A and 10B, descriptions already given with reference to FIG. 2 will be omitted. In addition, in FIGS. 10A and 10B, for convenience of illustration, illustrations of input lines providing an inverted first input value/X1 and a second input value X2 are omitted.

In some embodiments, a row decoder may be connected to a cell array through a plurality of output word lines as well as a plurality of word lines WLs. One of the plurality of output word lines may enable outputting a value operated from a value stored in a memory cell. For example, as shown in FIG. 10A, a memory cell Ma may include a first output transistor OT1 and a second output transistor OT2 each having a gate connected to the output word line OWL. The first output transistor OT1 may provide the first output value Y1 to the first bit line BL1 in response to the output word line OWL which is activated, and the second output transistor OT2 may provide the second output value Y2 to the second bit line BL2 in response to the output word line OWL which is activated.

A logic operation circuit of the memory cell Ma may include a first P-channel transistor PT1, a first N-channel transistor NT1, a second P-channel transistor PT2, and a second N-channel transistor NT2. As described above with reference to FIGS. 6 to 9B, the first P-channel transistor PT1 and the first N-channel transistor NT1 may generate the first output value Y1 corresponding to an inverted value of a maximum value of the storage value Q and the first input value X1, and the second P-channel transistor PT2 and the second N-channel transistor NT2 may generate the second output value Y2 corresponding to a minimum value of the storage value Q and the second input value X2.

Referring to a table on the bottom of FIG. 10A, the word line WL may be activated in a read operation and a write operation, and the output word line OWL may be activated when a logic operation is performed, that is, when a minimum value and a maximum value are output (or read). Accordingly, the first bit line BL1 and the second bit line BL2 may not only be used to store a ternary value Q in the memory cell Ma or read the ternary value Q stored in the memory cell Ma, but also be used to output a result of performing a logic operation on the ternary value Q stored in the memory cell Ma to the outside of a cell array. In some embodiments, different from that shown in FIG. 10A, a page buffer may also maintain the inverted first value/X1 and the second value X2 to a ground potential in a read operation, a write operation, and a hold operation to minimize an influence on the write operation and the read operation by the logic operation circuit.

Referring to FIG. 10B, compared to the memory cell Ma of FIG. 10A, a memory cell Mb of FIG. 10B may further include a third inverter INV3. The third inverter INV3 may be used to invert the storage value Q, the inverted storage value/Q generated by the third inverter INV3 may be provided to a source of the first P-channel transistor PT1, and the first input value X1 may be provided to a gate of the first P-channel transistor PT1. The logic operation circuits for generating the maximum values and the minimum values shown in FIGS. 10A and 10B are only examples, and various embodiments using the examples described above with reference to FIGS. 6 to 9B are possible.

Figure 11:
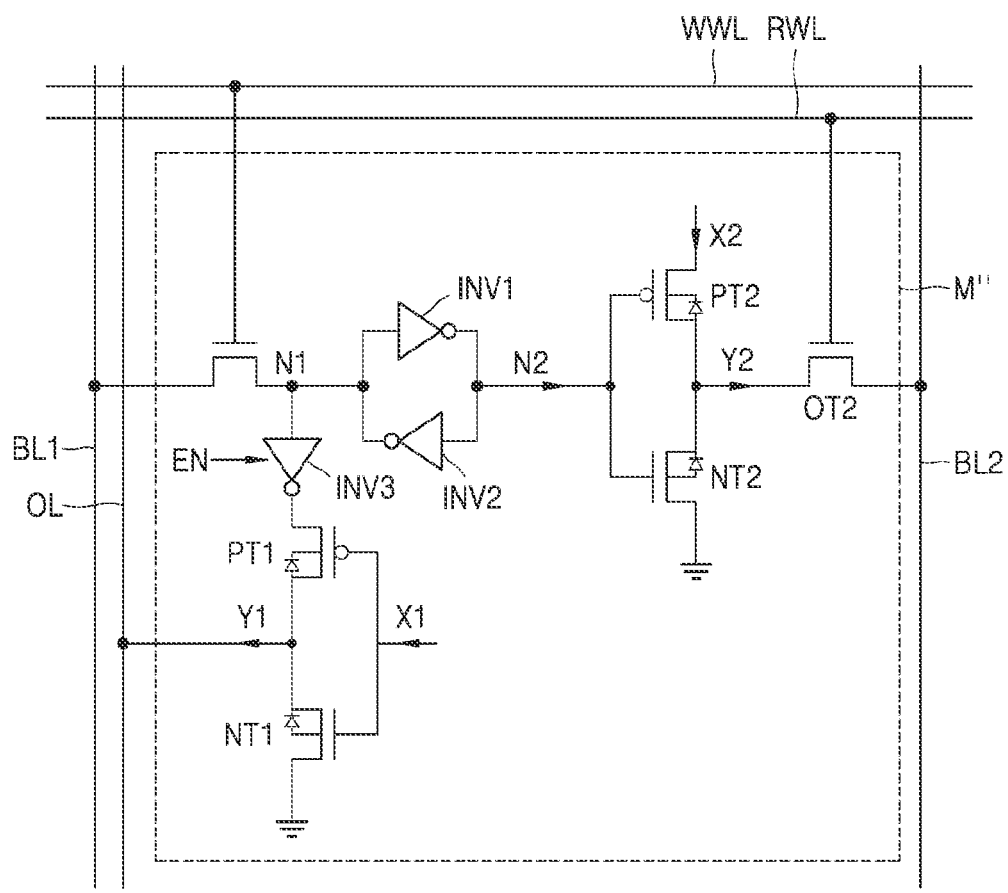
FIG. 11 shows an example of a memory cell according to an example embodiment of the present disclosure.

FIG. 11 shows an example of a memory cell according to an example embodiment of the present disclosure. In particular, the upper portion of FIG. 11 is a circuit diagram illustrating a memory cell M" having a structure in which a bit line for a write operation and a bit line for both a read operation and a logic operation are separated, and the lower portion of FIG. 11 is a table showing operations of the memory cell M". Hereinafter, in the descriptions of FIG. 11, descriptions already given with reference to FIG. 2 will be omitted, and in FIG. 11, for convenience of illustration, illustration of input lines providing the first input value X1 and the second input value X2 are omitted.

In some embodiments, a row decoder may be connected to a cell array through a plurality of write word lines and a plurality of read word lines as a plurality of word lines, wherein a write word line may be activated in a write operation, and a read word line may be activated in a read operation or a logic operation. For example, as shown in FIG. 11, the memory cell M" may include a write transistor WT having a gate connected to a write word line WWL and a read transistor RT having a gate connected to a read word line RWL. The write transistor WT may provide a value to be stored in the memory cell M" to a first node N1 from the first bit line BL1 in response to the write word line WWL which is activated, and the read transistor RT may provide the storage value Q or the second output value Y2 to the second bit line BL2 in response to the read word line RWL which is activated.

In some embodiments, the page buffer may be connected to the cell array through a plurality of output lines. The page buffer may receive an output value obtained by performing a logic operation from a memory cell through an output line. That is, the output line may be provided independently of a bit line for an output value obtained by performing a logic operation. Different from that shown in FIG. 11, in some embodiments, the first output value Y1 may also be provided to the second bit line BL2 through a read transistor, and the second output value Y2 may be independently outputted through an output line OL.

Referring to a table on the bottom of FIG. 11, in a minimum value operation in which a minimum value of the storage value Q and the second input value X2 is output, page buffer may provide a value (i.e., X2) required for the operation, and may provide the positive supply voltage VDD corresponding to 2, which is the greatest among a ternary value, as the second input value X2 in a read operation. Accordingly, the second P-channel transistor PT2 and the second N-channel transistor NT2 may function as an inverter, and the second output value Y2 matching the storage value Q may be provided to the second bit line BL2. In some embodiments, the first input X1 may be maintained at a constant voltage (e.g., a ground potential) in operations except for a maximum value operation, and similarly, the second input X2 may be maintained at a constant voltage (e.g., a ground potential) in operations except for the minimum value operation and a read operation. In addition, in some embodiments, the third inverter INV3 may provide an inverted value /Q obtained by inverting the storage value Q according to an enable signal EN which is activated in the maximum value operation to the first P-channel transistor PT. For example, as shown in a table on the bottom of FIG. 11, the enable signal EN may be activated in the maximum value operation, for example, may have the positive supply voltage VDD, and may be inactivated in other operations, for example, may have a ground potential.

Figure 12A:
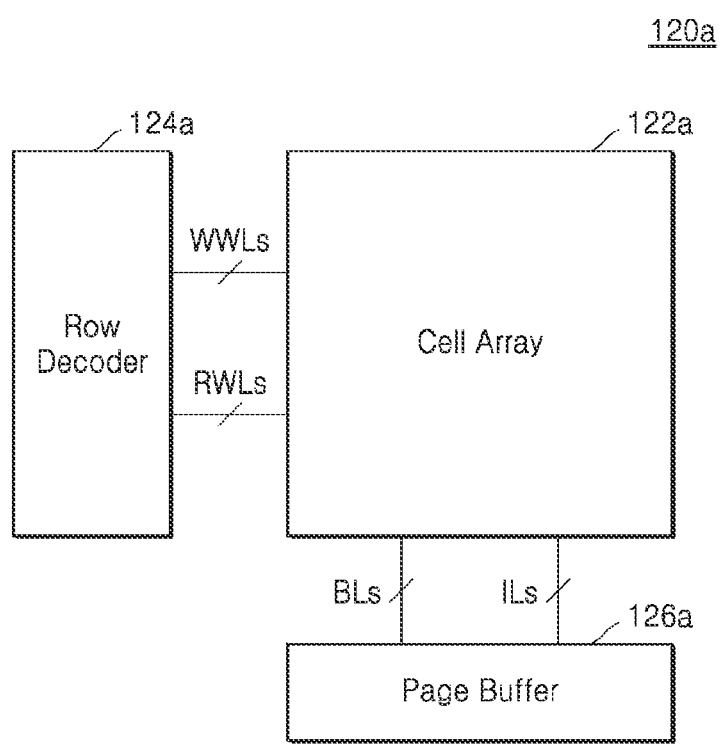
FIGS. 12A and 12B are block diagrams each illustrating an example of a memory device according to an example embodiment of the present disclosure.
Figure 12B:
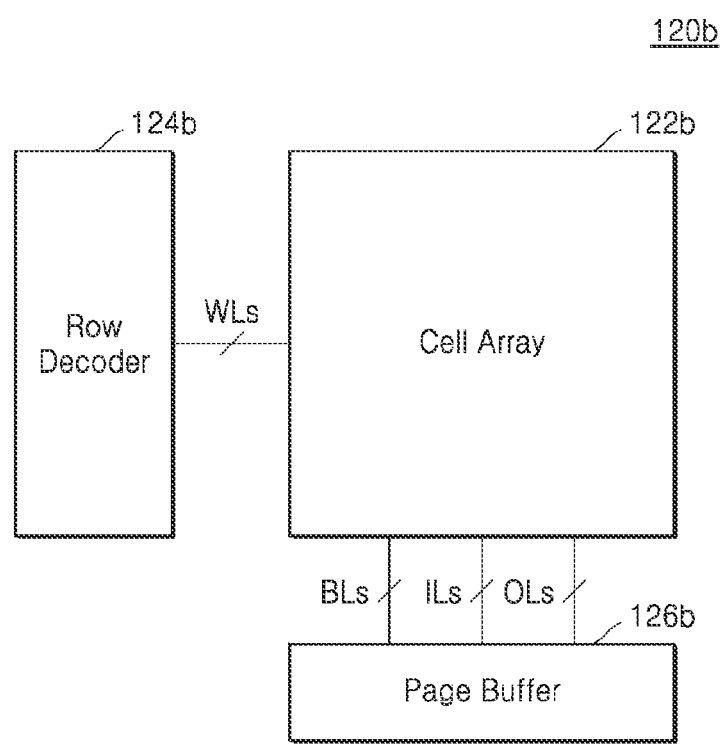

FIGS. 12A and 12B are block diagrams each illustrating an example of a memory device according to an example embodiment of the present disclosure. As described above with reference to the drawings above, a row decoder and a page buffer may perform a write operation, a read operation, and a logic operation on a ternary memory cell including a logic operation circuit in various ways, and some examples are shown in FIGS. 12A and 12B. Duplicate contents in the description of FIGS. 12A and 12B will be omitted.

Referring to FIG. 12A, a memory device 120a may include a cell array 122a, a row decoder 124a, and a page buffer 126a. The row decoder 124a may be connected to the cell array 122a through a plurality of write word lines WWLs and a plurality of read word lines RWLs. In addition, the page buffer 126a may be connected to the cell array 122a through a plurality of bit lines BLs and a plurality of input lines ILs. As described with reference to FIG. 11, the plurality of write word lines WWLs may be used in a write operation, and the plurality of read word lines RWLs may be used in a read operation and a logic operation. Accordingly, the plurality of input lines ILs may be used to provide an input value for a logic operation, and the plurality of bit lines BLs may be used as a path through which a result value of a logic operation as well as a write operation and a read operation is provided from the cell array 122a to the page buffer 126a.

Referring to FIG. 12B, a memory device 120b may include a cell array 122b, a row decoder 124b, and a page buffer 126b. The row decoder 124b may be connected to the cell array 122b through a plurality of word lines WLs. In addition, the page buffer 126b may be connected to the cell array 122b through a plurality of bit lines, a plurality of input lines ILs, and a plurality of output lines OLs. As described with reference to FIG. 11, an independent path, that is, the plurality of output lines OLs, may be used to output a result value of a logic operation. Accordingly, the plurality of input fines ILs may be used to provide an input value for a logic operation, the plurality of bit lines BLs may be used in a write operation and a write operation, the plurality of output lines OLs may be used in a logic operation.

In some embodiments, a memory device may have a structure according to various combinations of FIGS. 12A and 12B. For example, the memory device 120a of FIG. 12A may include the plurality of output lines OLs, and the plurality of word lines WLs of the memory device 120b of FIG. 12B may also include the plurality of write word lines WWLs and the plurality of read word lines RWLs. In addition, in some embodiments, as described above with reference to FIGS. 11A and 11B, a row decoder may also be connected to a cell array through a plurality of output lines.

Figure 13:
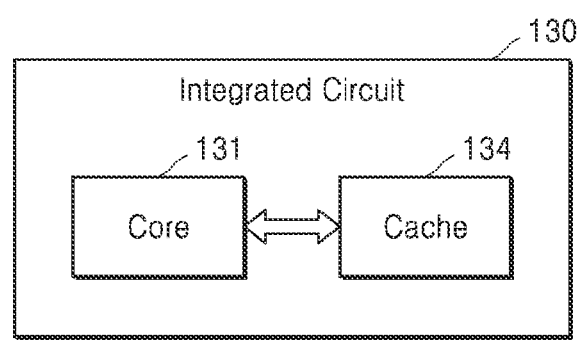
FIG. 13 is a diagram of an integrated circuit including a memory device according to an example embodiment of the present disclosure.

FIG. 13 is a diagram of an integrated circuit 130 including a memory device according to an example embodiment of the present disclosure.

The integrated circuit 130 may refer to any device that performs digital arithmetic operations, such as a central processing unit (CPU), a graphic processing unit (GPU), a digital signal processor, a communication processor (CP), an application processor (AP), or the like, as non-limiting examples. As shown in FIG. 13, the integrated circuit 130 may include a core 131 and a cache 134, and in some embodiments, the integrated circuit 130 may include a plurality of cores, that is, a multi-core.

A memory device according to example embodiments of the present disclosure described with reference to drawings may be included in the integrated circuit 130 as the cache 134 of the core 131 executing instructions. For example, the core 131 may execute a series of instructions stored in the cache 134 or process data stored in the cache 134 by the series of instructions. As described above with reference to the drawings, the cache 134, as a memory device according to an example embodiment of the present disclosure, may not only provide high storage capacity, but also enable a logic-in-memory performing a ternary logic operation, and thus, the performance of the integrated circuit 130 may be improved by providing an improved operating speed.

Example embodiments have been disclosed in the drawings and the present disclosure as described above. Although embodiments have been described using specific terms in the present disclosure, these are used only for the purpose of explaining the technical concept of the present disclosure but are not used to limit the present disclosure, and are not used to limit the meaning or scope of the present disclosure. Therefore, it will be understood by those skilled in the art that various modifications and equivalent other embodiments are possible therefrom. Accordingly, the true technical protection scope of the present disclosure should be defined by the technical spirit of the appended claims.

The invention claimed is:

1. A memory device for a logic-in-memory, comprising:
a cell array comprising a plurality of ternary memory cells;
a row decoder configured to select at least one ternary memory cell from among the plurality of ternary memory cells; and
a page buffer configured to provide a first value to the at least one ternary memory cell and latch a third value obtained by performing a logic operation on the first value and a second value stored in the at least one ternary memory cell and/or the second value,
wherein the at least one ternary memory cell comprises:
a first inverter and a second inverter, cross-coupled in a first node corresponding to the second value and a second node corresponding to an inverted value of the second value, and each comprising a pull-up device and a pull-down device, wherein the pull-up device and the pull-down device are configured to have a constant current pass therethrough upon turn-off; and
a logic operation circuit comprising a P-channel transistor and an N-channel transistor and configured to output the third value, wherein the P-channel transistor and the N-channel transistor are configured to have the constant current pass therethrough upon turn-off.

2. The memory device of claim 1, wherein the logic operation circuit is configured to output an inverted value of the third value corresponding to a maximum value of the first value and the second value, which are ternary values.

3. The memory device of claim 2, wherein the page buffer is configured to provide an inverted value of the first value to the at least one ternary memory cell and latch the inverted value of the third value,
the P-channel transistor has a gate to which the second value is applied, a source to which the inverted value of the first value is applied, and a drain outputting the inverted value of the third value, and
the N-channel transistor has a gate to which the first value is applied, a source connected to a ground potential, and a drain outputting the inverted value of the third value.

4. The memory device of claim 2, wherein the page buffer is configured to latch the inverted value of the third value,
the P-channel transistor has a gate to which the first value is applied, a source to which an inverted value of the second value is applied, and a drain outputting the inverted value of the third value, and
the N-channel transistor has a gate to which the first value is applied, a source connected to a ground potential, and a drain outputting the inverted value of the third value.

5. The memory device of claim 4, wherein the logic operation circuit comprises a pull-up device and a pull-down device which are configured to have the constant current pass therethrough upon turn-off, and comprises an inverter which is selectively enabled, and
the inverter is configured to receive the second value and, when enabled, provide the inverted value of the second value to the P-channel transistor.

6. The memory device of claim 1, wherein the logic operation circuit is configured to output the third value corresponding to a minimum value of the first value and the second value, which are ternary values.

7. The memory device of claim 6, wherein the P-channel transistor has a gate to which an inverted value of the second value is applied, a source to which the first value is applied, and a drain outputting the third value, and
the N-channel transistor has a gate to which the inverted value of the second value, a source to which a ground potential is applied, and a drain outputting the third value.

8. The memory device of claim 6, wherein the page buffer is configured to provide an inverted value of the first value to the at least one ternary memory cell,
the P-channel transistor has a gate to which the inverted value of the first value is applied, a source to which the second value is applied, and a drain outputting the third value, and
the N-channel transistor has a gate to which the inverted value of the first value is applied, a source to which a ground potential is applied, and a drain outputting the third value.

9. The memory device of claim 1, wherein the page buffer is configured to apply the second value and an inverted value of the second value to a pair of bit lines connected to the at least one ternary memory cell in a write operation and latch the third value through an output line connected to the at least one ternary memory cell in a read operation.

10. The memory device of claim 1, wherein the page buffer is configured to apply the second value and an inverted value of the second value to a pair of bit lines connected to the at least one ternary memory cell in a write operation and latch the third value through at least one of the pair of bit lines in a read operation.

11. The memory device of claim 1, wherein the page buffer is configured to apply the second value or an inverted value of the second value to a first bit line connected to the at least one ternary memory cell in a write operation and latch the third value through a second bit line connected to the at least one ternary memory cell in a read operation.

12. The memory device of claim 1, wherein the pull-up device has a same structure as the P-channel transistor, and
the pull-down device has a same structure as the N-channel transistor.

13. A memory device for a logic-in-memory, comprising:
a cell array comprising a plurality of ternary memory cells storing a ternary value, wherein
each of the plurality of ternary memory cells comprises a logic operation circuit configured to generate an inverted value of a third value corresponding to a maximum value of a first value provided to the ternary memory cell and a second value stored in the ternary memory cell, the logic operation circuit comprises a P-channel transistor and an N-channel transistor, which are configured to have a constant current pass therethrough and have a drain outputting the inverted value of the third value, the P-channel transistor has a gate and a source to which the first value and an inverted value of the second value are applied, respectively, or has a gate and a source to which the second value and an inverted value of the first value are applied, respectively, and the N-channel transistor has a gate and a source to which the first value and a ground potential are applied, respectively, or has a gate and a source to which the second value and the ground potential are applied, respectively.

14. A memory device for a logic-in-memory, comprising:

a cell array comprising a plurality of ternary memory cells each storing a ternary value, wherein each of the plurality of ternary memory cells comprises a logic operation circuit configured to generate a third value corresponding to a minimum value of a first value provided to the ternary memory cell and a second value stored in the ternary memory cell, the logic operation circuit comprises a P-channel transistor and an N-channel transistor, which are configured to have a constant current pass therethrough and have a drain outputting an inverted value of the third value, the P-channel transistor has a gate and a source to which an inverted value of the first value and the second value are applied, respectively, or has a gate and a source to which an inverted value of the second value and the first value are applied, respectively, and the N-channel transistor has a gate and a source to which the inverted value of the first value and a ground potential are applied, respectively, or has a gate and a source to which the inverted value of the second value and the ground potential are applied, respectively.

* * * * *